United States Patent [19]
Horiguchi

[11] Patent Number: 5,932,914
[45] Date of Patent: Aug. 3, 1999

[54] SEMICONDUCTOR PROTECTION DEVICE FORMED INSIDE A WELL HAVING CONTACT WITH A BURIED LAYER

[75] Inventor: Yoko Horiguchi, Tokyo, Japan

[73] Assignee: NEC Corporation, Tokyo, Japan

[21] Appl. No.: 08/898,344

[22] Filed: Jul. 22, 1997

[30] Foreign Application Priority Data

Jul. 25, 1996 [JP] Japan .................................. 8-196189

[51] Int. Cl.⁶ .................................................. H01L 27/04
[52] U.S. Cl. ......................... 257/355; 257/356; 257/357; 257/358; 257/359; 257/360; 257/361; 257/362; 257/363
[58] Field of Search .................... 257/355–363; 327/91

[56] References Cited

U.S. PATENT DOCUMENTS

| | | | |
|---|---|---|---|
| 5,248,892 | 9/1993 | Van Roozendaal et al. | 257/358 |
| 5,324,982 | 6/1994 | Nakazato et al. | 257/355 |
| 5,449,939 | 9/1995 | Horiguchi et al. | 257/360 |
| 5,623,387 | 4/1997 | Li et al. | 257/355 |

FOREIGN PATENT DOCUMENTS

| | | |
|---|---|---|
| 60-58657 | 4/1985 | Japan . |
| 60-241251 | 11/1985 | Japan . |
| 3-234052 | 2/1990 | Japan . |
| 4-71274 | 7/1990 | Japan . |

OTHER PUBLICATIONS

F. Fong and C. Hu, "Internal ESD Transients in Input Protection Circuits", *1989 IEEE/IRPS*, pp. 77–81.

*Primary Examiner*—Fetsum Abraham
*Attorney, Agent, or Firm*—Sughrue, Mion, Zinn, Macpeak & Seas, PLLC

[57] ABSTRACT

The present invention provides an electrostatic breakdown protecting device which has a high electrostatic breakdown resistance, a high latch up resistance and an excellent protective ability and which has no dead space in the vicinity of protective elements. The present invention includes an I/O terminal directly connected to a protective diode comprising a p-type diffusion layer 103a and an n-type diffusion layer 102b, and an NPN protective bipolar transistor comprising n-type diffusion layers 102b, 102c and a p-type well 113 and connected to an NMOSFET for protection comprising n-type diffusion layers 102c, 102d and a gate electrode 105 via an input resistor 114. These protective elements are formed on the p-type well 113 separated from a substrate for an internal circuit by an n-type buried diffusion layer 111 and an n-type well 112. The internal circuit to be protected is connected to a drain 102d of the NMOSFET for protection.

5 Claims, 5 Drawing Sheets

SEMICONDUCTOR PROTECTION DEVICE FORMED INSIDE A WELL HAVING CONTACT WITH A BURIED LAYER

BACKGROUND OF THE INVENTION

1. Field of the Invention

The present invention relates to a semiconductor device, and more specifically, it relates to an electrostatic breakdown protecting device of a semiconductor integrated circuit.

2. Description of the Related Art

FIG. 3 shows a circuit diagram of an electrostatic breakdown protecting device in a semiconductor integrated circuit, and FIG. 4 shows its layout diagram, and FIG. 5 shows a sectional view cut along the line b—b in FIG. 4.

In FIGS. 4 and 5, a protective diode is a PN diode comprising a p-type diffusion layer 403 and an n-type diffusion layer 402a on a p-type semiconductor substrate 401. The p-type diffusion layer 403 is connected to an earth wire via an aluminum wire 409a, and the n-type diffusion layer 402a is connected to an I/O terminal 415 via an aluminum wire 410a. Reference numeral 408 is an interlayer insulating film, and numeral 416 is an electric contact.

A protective bipolar transistor is an NPN bipolar transistor comprising the p-type semiconductor substrate 401 as a base, the n-type diffusion layer 402a as a collector and an n-type diffusion layer 402b as an emitter. The n-type diffusion layer 402a which is a collector region of this transistor is connected to the I/O terminal 415 through the aluminum wire 410a, and the n-type diffusion layer 402b which is an emitter region is connected to the earth wire through an aluminum wire 409b.

An NMOSFET for protection is an n-type LDDMOSFET comprising n-type diffusion layers 402c, 402d and a gate electrode 405 on the p-type semiconductor substrate 401. The n-type diffusion layer 402c which is a source region of this transistor and the gate electrode 405 are connected to the earth wire through an aluminum wire 409c. Furthermore, the n-type diffusion layer 402d which is a drain region is connected to the I/O terminal 415 via an aluminum wire 410b, an input resistor 414 and an aluminum wire 410c. Reference numeral 406 is a gate oxide film, and numeral 407 is a side wall insulating film. Furthermore, numeral 404 is a field oxide film.

In the circuit diagram of FIG. 3 in the case that a voltage such as an electrostatic pulse is applied to an I/O terminal 315 and when current flows into an internal circuit via an input resistor 314, the internal circuit tends to be broken. Therefore, for positive application, a discharge path is formed by a protective bipolar transistor 318 and an NMOSFET 319 for protection, and for negative application, the discharge path is formed by a protective diode 317. Thus, when extraordinary voltage is applied, these protective elements become conductive, so that the voltage is clamped to protect the internal circuit.

That is to say, in the case that an extraordinary voltage pulse which is positive to an earth terminal is applied to the I/O terminal, the voltage of the drain diffusion layer 402d of the NMOSFET for protection and the voltage of the n-type diffusion layer 402a which is the collector region of the protective bipolar transistor rise in the first place. At this time, a breakdown voltage (Vbd) of an avalanche breakdown between the drain and the substrate is lower than a Vbd between the collector and the substrate owing to the function of a gate control diode (GCD) comprising the drain, the gate and the substrate, so that an avalanche occurs between the drain and hence the substrate and a substrate potential in the vicinity of the avalanche rises. Then, a forward direction bias is applied between the source and the substrate, so that a parasitic bipolar comprising the drain of the NMOSFET, the substrate and the source is operated and a voltage between the drain and the source is lowered and then fixed (Vsbmos), whereby the internal circuit is protected. If an overvoltage is high and the voltage rise of the terminal further continues, the bipolar is then operated between the collector and the emitter of the protective bipolar transistor, and the voltage is lowered (Vsbbip). At this time, a clamp voltage Vsbbip of the bipolar transistor is lower than a clamp voltage Vsbmos of the MOSFET (Vsbbip<Vsbmos), and most of a discharge current flows through the bipolar transistor, so that the NMOSFET for protection is not broken and does not fail from overvoltage.

In the case that extraordinary voltage pulse which is negative to the earth terminal is applied to the I/O terminal, the protective diode allows the current to flow in a forward direction, so that the internal circuit is protected.

In the above-mentioned conventional example, however, when the voltage is applied to the I/O terminals electrons generated from the protective elements diffuse to the internal element via the substrate, so that these electrons are injected into the gate oxide film of the MOSFET in the internal circuit, whereby the change of characteristics takes place and in the worst case, the MOSFET is broken.

Furthermore, between a p-channel type transistor and an n-channel type transistor of the internal circuit which are close to each other, latch up might be caused by a potential rise of the substrate due to the operation of the protective elements.

In order to avoid these problems, it is necessary to secure a long distance between the protective element and the internal element, and such a construction gives rise to a problem that a useless pattern area is required.

For the purpose of preventing the above-mentioned disadvantage caused by an interaction between the protective circuit and the internal circuit, techniques in which a separation layer is arranged between the protective circuit and the internal circuit have been disclosed in the following two publications, but these techniques have some drawbacks.

The technique disclosed in Japanese Patent Application Laid-open No. 58657/1985 utilizes a bipolar manufacturing technique to separate a diode which is the protective element from the substrate, whereby an influence on the internal circuit can be shut out. However, the protective element comprises the diode alone, and so a clamp performance is poor and a large area is inconveniently required.

The technique disclosed in Japanese Patent Application Laid-open No. 241251/1985 similarly utilizes the bipolar manufacturing technique, but in this technique, a bipolar element which is formed simultaneously with an internal bipolar element is used as the protective element. In consequence, the technique has a drawback that a breakdown resistance of the protective element itself to a surge voltage noticeably deteriorates.

In addition, the above-mentioned conventional example shown in FIGS. 3 to 5 further has the following problem. In the protective bipolar transistor, an impedance of its clamp current route is required to be lowered as much as possible, and hence, the protective bipolar transistor is arranged in the vicinity of a bonding pad. Consequently this area is occupied by the protective bipolar transistor. Therefore, the NMOSFET for protection is arranged so as to be slightly separated from the protective bipolar transistor on a layout. Thus, the positioning relation, i.e., a the arrangement of the NMOSFET for protection and the protective bipolar transistor depends upon a chip layout, so that the operation of the protective bipolar transistor does not work as expected on occasion. Furthermore, the conventional example has a drawback that the operation of the protective bipolar transistor is affected by not only the factor of this chip layout but also characteristics, i.e., an impurity concentration and a fault distribution of the semiconductor substrate.

SUMMARY OF THE INVENTION

An object of the present invention is to provide an electrostatic breakdown protecting device which can solve the above-mentioned problems and which has a high electrostatic breakdown resistance, a high latch up resistance and an excellent protective ability and which has no dead space in the vicinity of a protective element.

The first aspect of the present invention is directed to a semiconductor device comprising on a first conductive semiconductor substrate, a second conductive buried diffusion layer, a second conductive well whose bottom is in contact with the upper portion of the buried diffusion layer and which is formed into a circular shape, and a first conductive well isolated inside the second conductive well; and on the first conductive well, an MOSFET comprising the first of a second conductive diffusion layer connected to a metallic terminal via an input resistor as a drain connected to an internal circuit to be protected, the second of a second conductive diffusion layer connected to a first reference potential as a source, and a gate electrode connected to the first reference potential, and a bipolar transistor comprising the second of the second conductive diffusion layer as an emitter, the third of a second conductive diffusion layer connected to the metallic terminal formed opposite to the second of the second conductive diffusion layer as a collector, and the first conductive isolated well as a base.

The second aspect of the present invention is directed to the semiconductor device according to the first aspect of the present invention wherein a first conductive diffusion layer surrounding the first, the second and the third of the second conductive diffusion layers is formed on the first conductive well; and its portion is opposite to the third of the second conductive diffusion layer, a desired space being interposed therebetween; and in its opposite portion, a diode is formed.

In the first and second aspects of the present invention, the second conductive well may be connected to a second reference potential. In consequence, in the case that an overvoltage is applied between a second reference potential terminal and an I/O terminal, an NPN bipolar transistor of the third of the second conductive diffusion layer, the first conductive well and the second conductive buried diffusion layer is operated to enhance an electrostatic breakdown resistance.

In the second aspect of the present invention, the first conductive diffusion layer may be connected to the first reference potential. In consequences the potential of the first conductive well is fixed, whereby the leakage of the MOSFET or the bipolar transistor at the time of use can be prevented.

According to the present invention, the diffusion of electrons generated from the protective elements into the internal elements can be completely shut out without any increase of a pattern area, and what is more, the protective elements can more easily be operated. Accordingly, an electrostatic breakdown protecting device can be provided which has a high electrostatic breakdown resistance, a high latch up resistance and an excellent protective ability and which has no dead spaces in the vicinity of the protective elements.

DETAILED DESCRIPTION OF THE PREFERRED EMBODIMENTS

Figure 1:
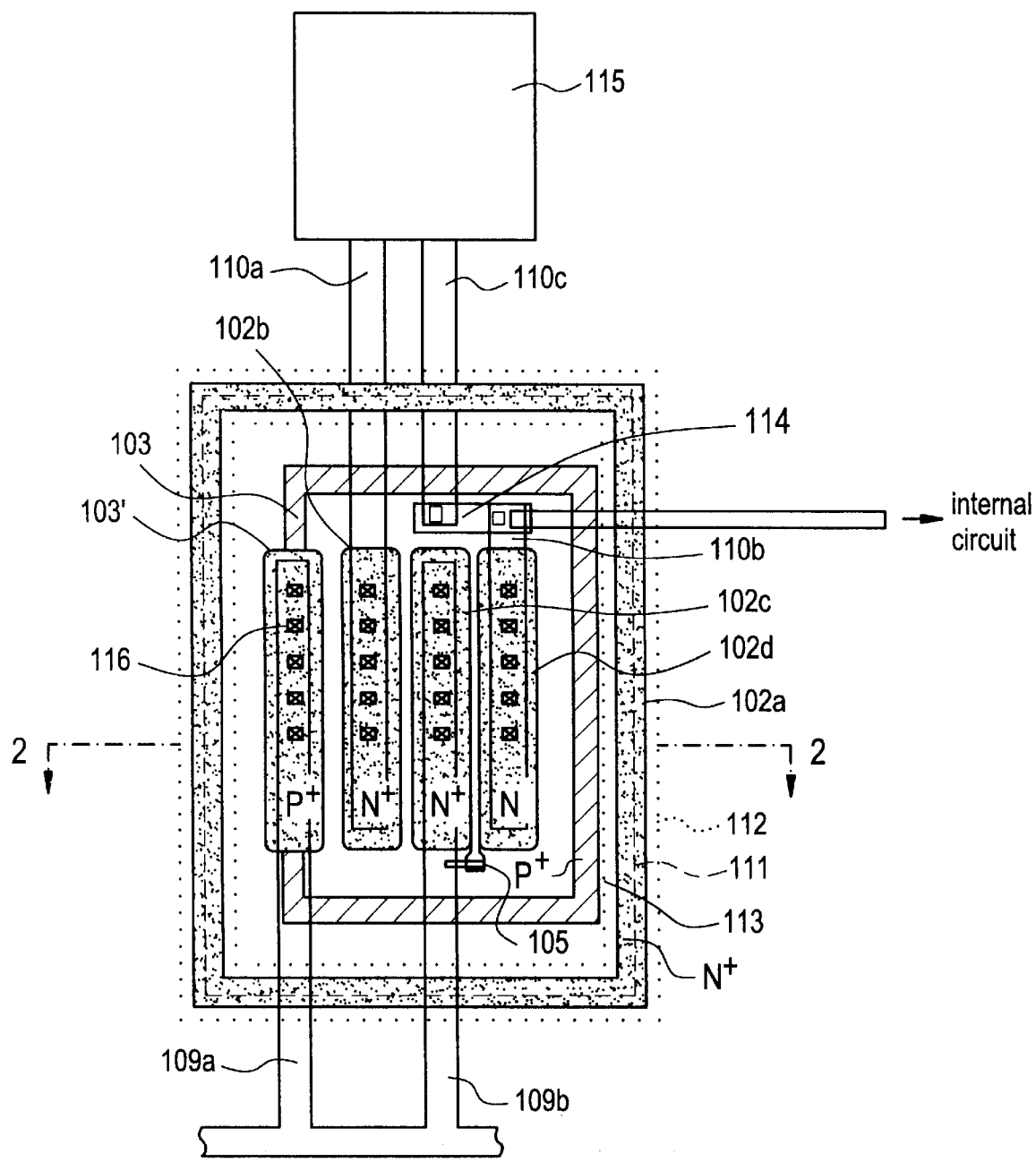
FIG. 1 is a layout diagram of an electrostatic breakdown protecting device according to the present invention.
Figure 2:
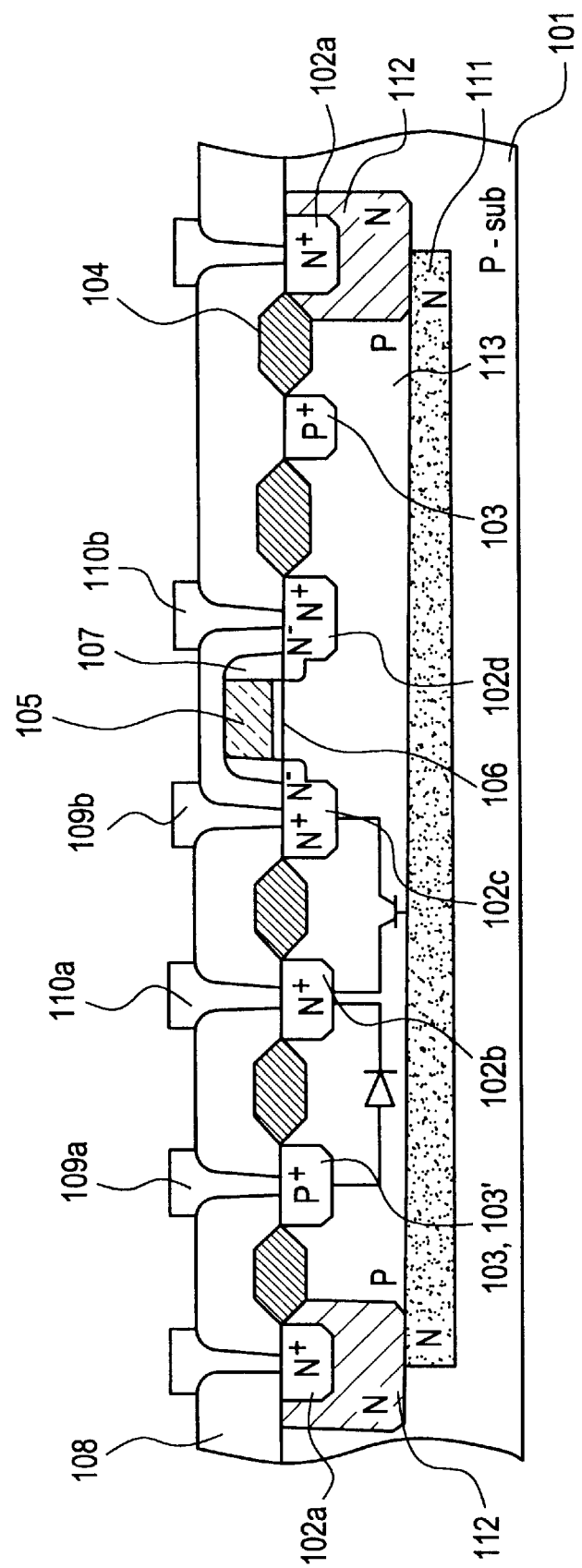
FIG. 2 is a sectional view (a sectional view cut along the line a—a in FIG. 1) of the electrostatic breakdown protecting device according to the present invention.
Figure 3:
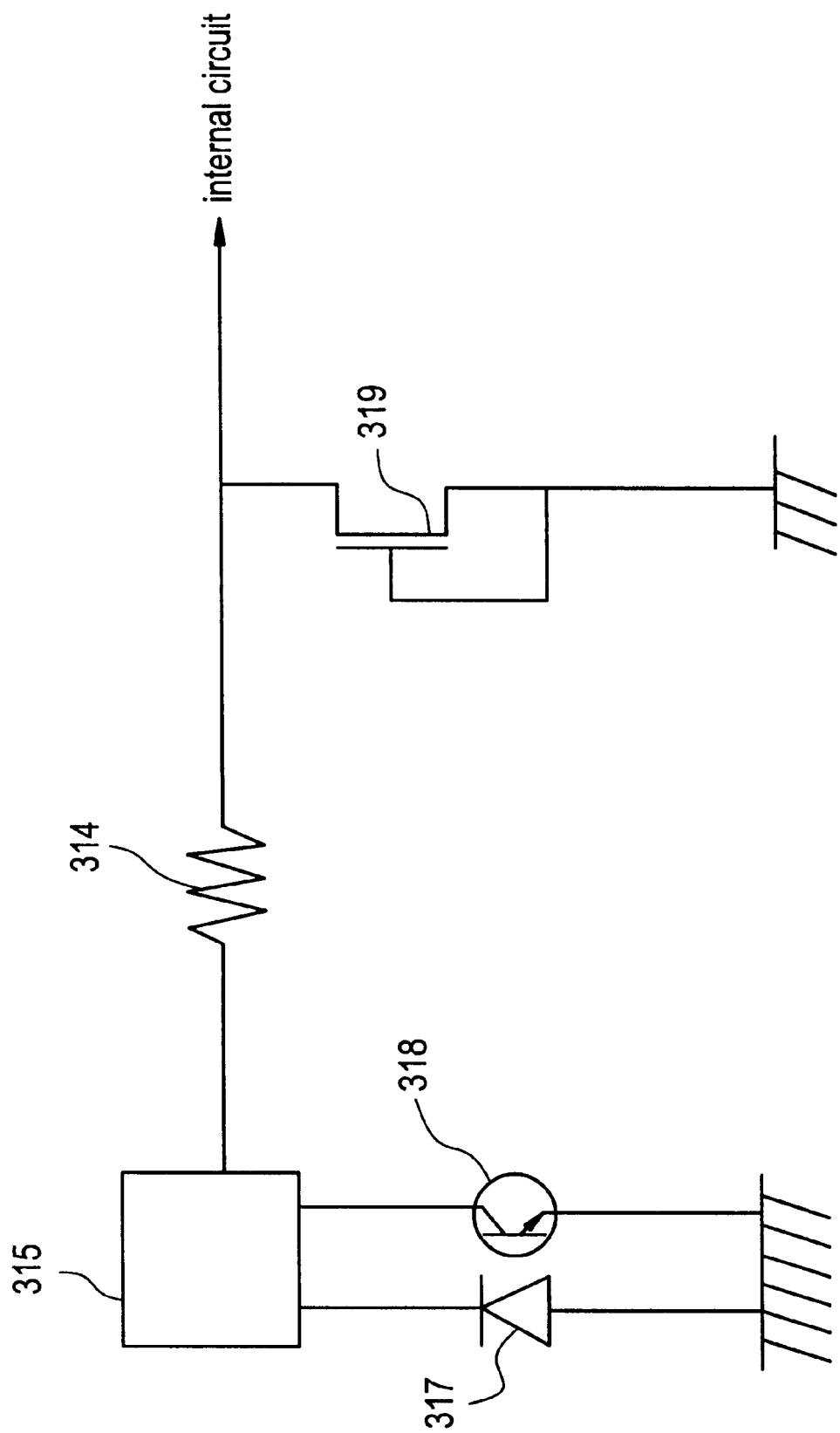
FIG. 3 is a circuit diagram of the electrostatic breakdown protecting device according to the present invention or a conventional technique.
Figure 4:
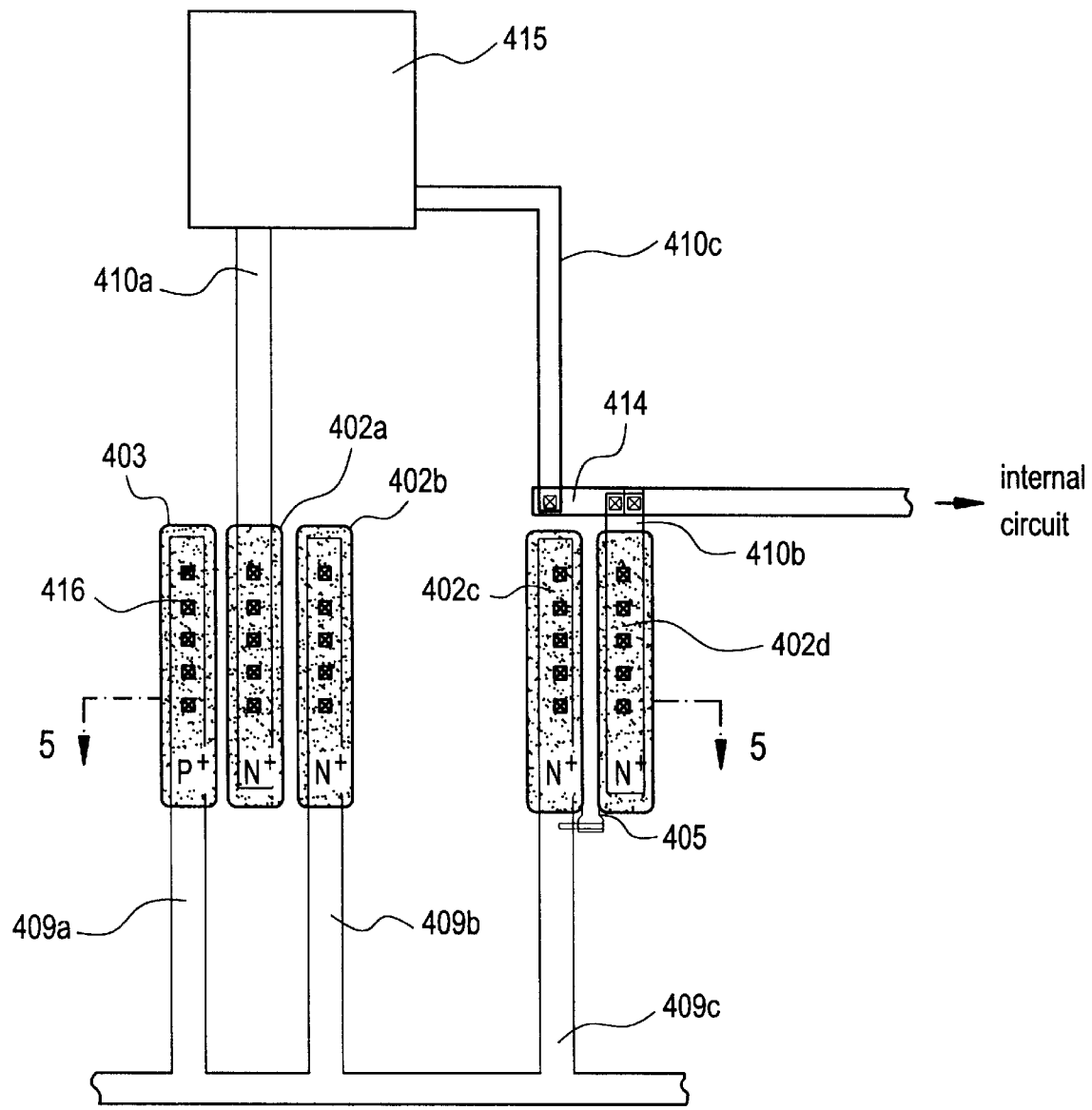
FIG. 4 is a layout diagram of the conventional electrostatic breakdown protecting device.
Figure 5:
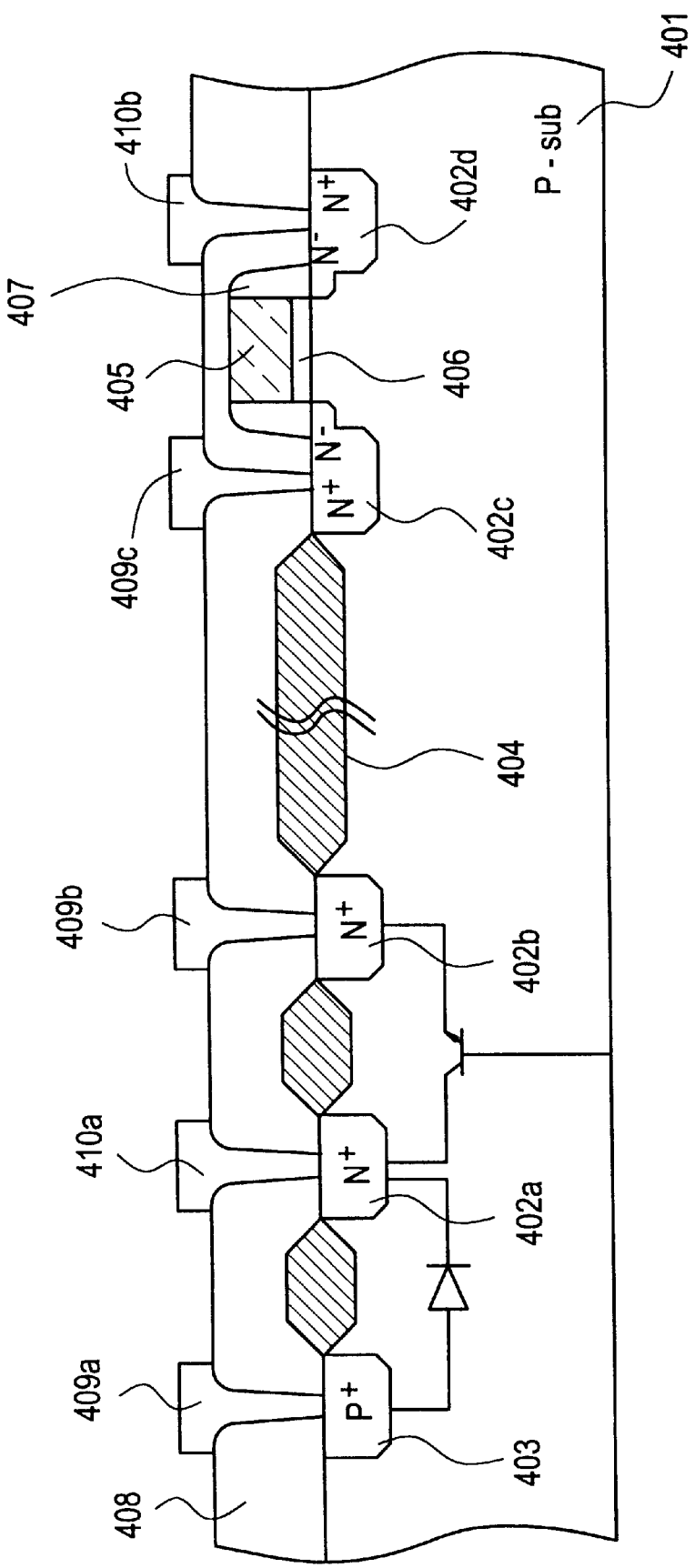
FIG. 5 is a sectional view of the conventional electrostatic breakdown protecting device.

An I/O terminal (115) is connected to a protective diode 317, a protective bipolar transistor 318 and an NMOSFET 319 for protection, as shown in FIG. 3. In the present invention, these elements are formed on the surface of a p-type well 113 separated from a p-type semiconductor substrate 101 by an n-type well 112 and an n-type buried diffusion layer 111, as shown in FIGS. 1 and 2.

The n-type well 112 and the n-type buried diffusion layer 111 have a power source potential by the use of a wire connected to an n+ diffusion layer 102a.

The protective diode is a pn diode comprising a p-type diffusion layer 103 and an n-type diffusion layer 102b. The p-type diffusion layer 103 is connected to an earth wire through an aluminum wire 109a. The n-type diffusion layer 102b is connected to an I/O terminal (315) through an aluminum wire 110a. Furthermore, a p-type diffusion layer 103' in FIG. 1 is disposed to adjust a distance to an n-type diffusion layer 102b and a contact field distance. Reference numeral 108 is an interlayer insulating film, and numeral 116 is an electric contact.

A protective bipolar transistor is an NPN bipolar transistor comprising the p-type well 113 as a base, the n-type diffusion layer 102b as a collector and an n-type diffusion layer 102c as an emitter. The n-type diffusion layer 102b which is a collector region of this transistor is connected to the I/O terminal 115 through the aluminum wire 110a. Moreover, the n-type diffusion layer 102c which is the emitter region is connected to an earth wire through an aluminum wire 109b.

The NMOSFET for protection is an n-type LDDMOSFET comprising n-type diffusion layers 102c, 102d formed on the surface of the p-type well 113, a gate electrode 105 and the like. Then-type diffusion layer 102c which is a source region of this transistor is connected to the earth wire through the aluminum wire 109b. In addition, the n-type diffusion layer 102d which is a drain region is connected to the I/O terminal 115 through an aluminum wire 110b, an input resistor 114 and an aluminum wire 110c. The gate electrode 105 is connected to the earth wire through the aluminum wire 109b. Reference numeral 106 is a gate oxide film, numeral 107 is a side wall insulating film, and 104 is a field oxide film.

In this embodiments electrons which are generated at the time of the operation of the protective elements and which are injected into the substrate are all absorbed by an n-type buried diffusion layer, whereby the diffusion of the electrons into the internal element can completely be prevented. Therefore, there can be solved a problem that an MOSFET of the internal circuit is damaged or broken down by the injected electrons in conventional protective elements.

Furthermore, since the p-type well (the substrate) on which the protective elements are formed is separated from the p-type well (the substrate) on which the internal circuit is formed, the potential of the substrate on which the internal circuit is formed does not fluctuate, even if the potential of the isolated well rises at the time of the operation of the protective elements. Therefore, latch up which is caused by the operation of the protective elements does not occur any more, and distances between the protective elements and the internal element can be shortened as compared with a conventional case. Hence, a useless space can be saved.

Additionally, in the present invention, since the protective elements (the protective diode, the protective bipolar transistor and the NMOSFET for protection) are all formed in the p-type well isolated by the n-type well and the n-type buried diffusion layer, and since the NMOSFET for protection and the protective bipolar transistor are adjacent to each other, the protective bipolar transistor starts to operate more easily than in the conventional case. That is to say, in the case that a positive voltage is applied to a terminal, the NMOSFET for protection first operates, as also described in the above-mentioned conventional example. At this time, the p-type well is isolated and is adjacent to the bipolar transistor, and hence a substrate potential in the vicinity of the bipolar transistor also rises to a degree sufficient to start the operation. Therefore, the NMOSFET for protection and the protective bipolar transistor operate substantially simultaneously to discharge an electrostatic pulse, and thus a protective ability is higher than in the conventional case.

Moreover, in the present invention, for both of the source of the NMOSFET for protection and the emitter of the protective bipolar transistor, the n-type diffusion layer 102c is used, and so the area of the protective elements can be decreased as compared with the conventional case.

What is claimed is:

1. A semiconductor device comprising:

on a first conductivity type semiconductor substrate, a second conductivity type buried diffusion layer, a second conductivity type well whose bottom is in contact with the upper portion of said buried diffusion layer and which is formed into a circular shape, and a first conductivity type well isolated inside said second conductivity type well; and on said first conductivity type well, an MOSFET for protection of said semiconductor device comprising first and second diffusion layers of second conductivity type, the first diffusion layer connected to an input resistor and to an internal circuit to be protected, the second diffusion layer connected to a first reference potential, and a gate electrode of said MOSFET connected to said first reference potential, and a bipolar transistor comprising said second diffusion layer connected to said first reference potential as an emitter and a third diffusion layer of second conductivity type connected to an input terminal as a collector, and said first conductivity type well as a base.

2. The semiconductor device according to claim 1, wherein a first conductivity type diffusion layer surrounds said MOSFET and bipolar transistor and is formed in said first conductivity type well and spaced apart from said bipolar transistor by said first conductivity type well, and said first conductivity type diffusion layer and said third diffusion layer of second conductivity type form a diode.

3. The semiconductor device according to claim 2, wherein the second conductivity type well is connected to a second reference potential.

4. The semiconductor device according to claim 2, wherein the first conductivity type diffusion layer is connected to the first reference potential.

5. The semiconductor device according to claim 1, wherein the second conductivity type well is connected to a second reference potential.

* * * * *

UNITED STATES PATENT AND TRADEMARK OFFICE
CERTIFICATE OF CORRECTION

PATENT NO. : 5,932,914
DATED : August 3, 1999
INVENTOR(S) : Yoko HORIGUCHI

It is certified that error appears in the above-identified patent and that said Letters Patent is hereby corrected as shown below:

Column 4, line 22, delete "(115)" and insert --315 (115)--.

Column 4, line 36, after "terminal" insert --115--.

Signed and Sealed this

Sixteenth Day of May, 2000

Attest:

Q. TODD DICKINSON

Attesting Officer

Director of Patents and Trademarks